(12) United States Patent
Kim et al.

(10) Patent No.: US 6,833,729 B2
(45) Date of Patent: Dec. 21, 2004

(54) SEMICONDUCTOR DEVICE WITH IMPEDANCE CALIBRATION FUNCTION

(75) Inventors: Yang Gyun Kim, Yongin (KR); Seung Beom Baik, Yongin (KR); Young Ho Shin, Yongin (KR)

(73) Assignee: ATLab Inc. (KR)

( * ) Notice: Subject to any disclaimer, the term of this patent is extended or adjusted under 35 U.S.C. 154(b) by 8 days.

(21) Appl. No.: 10/458,041

(22) Filed: Jun. 10, 2003

(65) Prior Publication Data

US 2004/0164763 A1 Aug. 26, 2004

(30) Foreign Application Priority Data

Feb. 26, 2003 (KR) ................................ 10-2003-0012051

(51) Int. Cl.$^7$ .......................................... H03K 19/003
(52) U.S. Cl. ............................ 326/30; 326/86; 326/90; 327/108
(58) Field of Search ............................. 326/30, 21, 86, 326/82, 87, 90; 327/108–112, 315, 170

(56) References Cited

U.S. PATENT DOCUMENTS

| | | | | |
|---|---|---|---|---|
| 6,060,907 A | * | 5/2000 | Vishwanthaiah et al. | ..... 326/87 |
| 6,424,175 B1 | * | 7/2002 | Vangal et al. | ................. 326/82 |
| 6,452,428 B1 | * | 9/2002 | Mooney et al. | ............. 327/108 |
| 6,567,318 B2 | * | 5/2003 | Bedarida et al. | ........ 365/189.05 |
| 6,570,402 B2 | * | 5/2003 | Koo et al. | ..................... 326/30 |

* cited by examiner

*Primary Examiner*—Vibol Tan
(74) *Attorney, Agent, or Firm*—Cantor Colburn LLP (57) ABSTRACT

Disclosed is a semiconductor device comprising a reference circuit for receiving a plurality of impedance control signals and generating a reference voltage, a transmission driving circuit for receiving the impedance control signals and a pair of differential input signals and outputting a pair of differential output signals to an external cable, and an impedance control signal generating circuit for receiving a difference signal of the differential output signals and the reference voltage and generating the impedance control signals.

13 Claims, 5 Drawing Sheets

SEMICONDUCTOR DEVICE WITH IMPEDANCE CALIBRATION FUNCTION

This U.S. nonprovisional patent application claims priority under 35 U.S.C. §119 of Korean Patent Application 2003-12051 filed on Feb. 26, 2002, the entire contents of which is hereby incorporated by reference.

BACKGROUND OF INVENTION

1. Field of the Invention

The present invention relates to a semiconductor device, and more particularly to a semiconductor device with impedance calibration function that means to calibrate internal load impedance in a semiconductor device to be compatible with impedance of an external cable when resistance in the semiconductor device varies due to parameter changes of semiconductor device fabrication process.

2. Description of Related Art

Recently, a serial data transmission system is getting adopted as a data transmission method to overcome limit of data transmission rate of a conventional parallel data transmission system. Generally, a serial data transmission system adopts a differential signal structure to increase noise immunity and uses a low voltage level signal to increase data transmission rate. Therefore, a Low Voltage Differential Signal (LVDS) system is successfully introduced into a market and a Serial Data Interface (SDI) such as Serial-ATA is being adopted in several applications.

In such serial data interface, impedance calibration between a transmitter and a receiver is very important. If impedance matching between a transmitter and a receiver is not properly performed, levels of transmission and receiving signals are changed. Further, the transmission and receiving signals are distorted due to reflected waves and Bit Error Rate (BER) of data transmission increases.

A specification of Serial-ATA which is a sort of serial data transmission system says that output impedance of a transmission driving circuit is differentially 100 Ω (allowable error: 150 Ω), and impedance of a cable connected to the transmission driving circuit is 50 Ω (differentially 100 Ω). Load resistance of the transmission driving circuit that determines output impedance of the transmission driving circuit is designed using resistance of a polysilicon layer or resistance of diffusion layer integrated in a semiconductor device. However, such resistance of a polysilicon layer or a diffusion layer in a semiconductor device generally have dispersion caused by process parameters, so that additional resistance adjusting means for satisfying the specification is needed.

SUMMARY OF THE INVENTION

It is a feature of an embodiment of the present invention to provide a semiconductor device capable of calibrating internal load impedance of a semiconductor device to be compatible with impedance of an external cable when real internal resistance value in a semiconductor device is different from a predetermined resistance value due to the change of process parameter in the fabrication of a semiconductor device.

In accordance with the present invention, there is provided a semiconductor device comprising a reference circuit for receiving a plurality of impedance control signals and generating a reference voltage, a transmission driving circuit for receiving the impedance control signals and a pair of differential input signals and outputting a pair of differential output signals to an external cable, and an impedance control signal generating circuit for receiving a difference signal of the differential output signals and the reference voltage and generating the impedance control signals.

Preferably, the reference circuit comprises a PMOS transistor with a gate electrode to which a bias voltage is applied and a drain from which the reference voltage is output, a current source connected between a power supply voltage and a source electrode of the PMOS transistor for supplying a current, and a variable impedance circuit connected between the drain electrode of the PMOS transistor and a ground voltage for receiving the impedance control signals and changing resistance value therein.

Preferably, the transmission driving circuit may comprise a first PMOS transistor with a gate electrode to which a first differential input signal is applied and a drain electrode from which a first differential output signal is output, a current source connected between a power supply voltage and a source electrode of the PMOS transistor for supplying a current, a second PMOS transistor with a source electrode connected to the source electrode of the first PMOS transistor, a gate electrode to which a second differential input signal is applied and a drain electrode from which a second differential output signal is output, a first variable impedance circuit connected between the drain electrode of the first PMOS transistor and a ground voltage for receiving the impedance control signals and changing resistance values, and a second variable impedance circuit connected between the drain electrode of the second PMOS transistor and a ground voltage for receiving the impedance control signals and changing resistance values, wherein the first variable impedance circuit and the second variable impedance circuit have the same impedance value at the same time.

Preferably, the variable impedance circuit comprises a plurality of resistors having respective one ends connected commonly to the drain electrode of the first PMOS transistor, and a plurality of NMOS transistors connected between the other end of each of the resistors and a ground voltage, respectively, and having respective gate electrodes to which the respective impedance control signals are applied.

Preferably, the resistors have respective different resistance values ranging from R to $2^{(N-1)}R$, when the impedance control signals are consisted of N bits and a resistor having the least resistance value is R. Preferably, the impedance control signal generating circuit comprises a comparator for receiving a difference signal of the first and second differential output signals and the reference voltage, comparing the same with each other, and generating the result signal of the comparison, and a counter for receiving the result signal output from the comparator and generating the impedance control signals.

BRIEF DESCRIPTION OF THE DRAWINGS

The above and other features and advantages of the present invention will become readily apparent to those of ordinary skill in the art by describing in detail preferred embodiments thereof with reference to the attached drawings in which.

DETAILED DESCRIPTION OF THE INVENTION

Hereinafter, the present invention will be described in detail by describing preferred embodiments of the present invention with reference to the accompanying drawings. Like reference numerals refer to like elements throughout the drawings.

Figure 1:
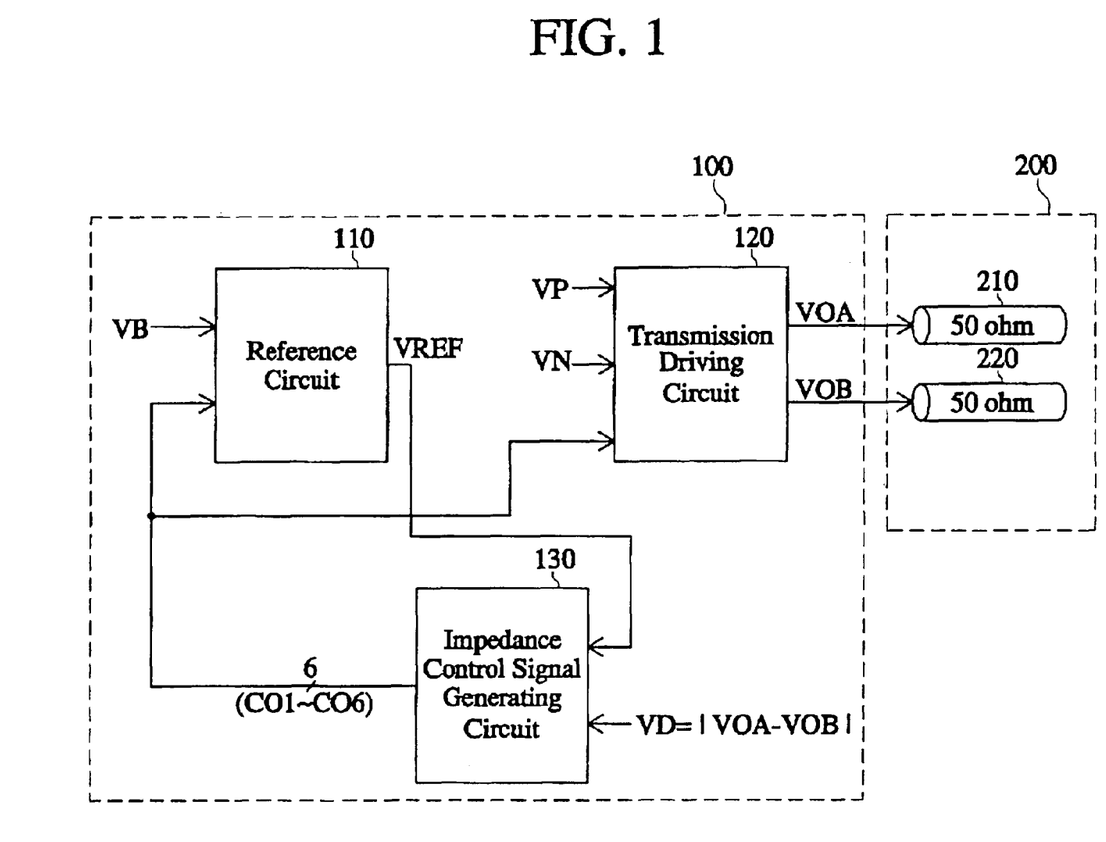
FIG. 1 is a block diagram of a circuit in a semiconductor device with an impedance calibration function in accordance with the present invention.

FIG. 1 illustrates a semiconductor device with impedance calibration function in accordance with the present invention, wherein the semiconductor device uses six-bit of impedance control signals. Referring to FIG. 1, a semiconductor device in accordance with the present invention comprises a reference circuit 110 for generating a reference voltage VREF by receiving a bias voltage VB and impedance control signals CO1, CO2, CO3, CO4, CO5 and CO6, a transmission driving circuit 120 for receiving a pair of differential input signals VP, VN and the impedance control signals CO1, CO2, CO3, CO4, CO5 and CO6, and outputting a pair of differential output signals VOA, VOB of a semiconductor device 100 to an external cable 200, and an impedance control signal generating circuit 130 for receiving a difference signal (VD=|VOA−VOB|) of the pair of differential output signals VOA, VOB and the reference voltage VREF and for generating the impedance control signals CO1, CO2, CO3, CO4, CO5 and CO6.

Figure 2:
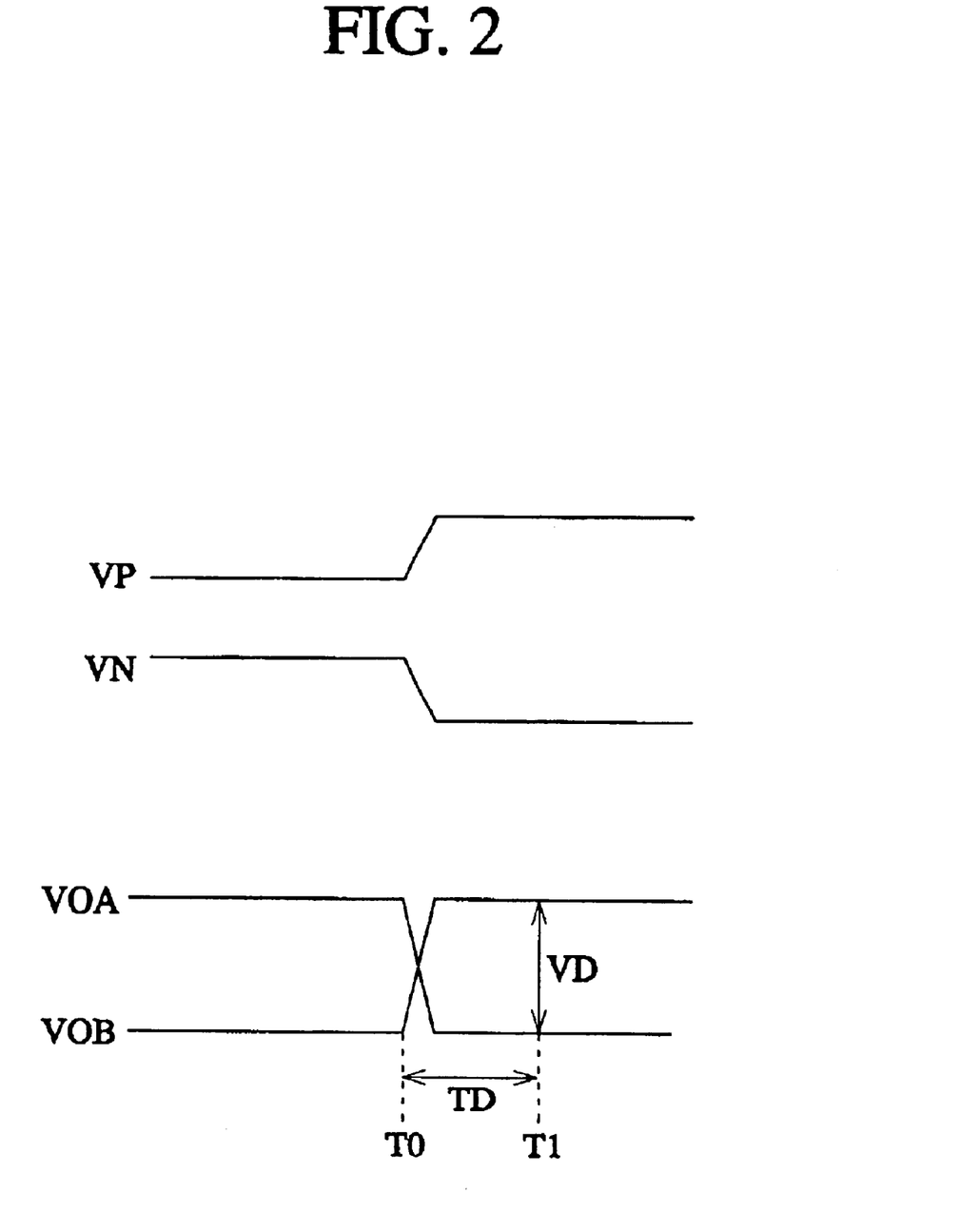
FIG. 2 is a timing diagram of the circuit shown in FIG. 1.

FIG. 2 illustrates the timing diagram of the circuit shown in FIG. 1.

The operation of the circuit shown in FIG. 1 will be described below with reference to FIG. 2.

The transmission driving circuit 120 drives a low impedance load and generates it to outside of the semiconductor device 100. As shown in FIG. 2, the differential input signals VP, VN of the transmission driving circuit 120 has the opposite phases, and the differential output signals VOA, VOB has also the opposite phases. The pair of differential output signals VOA, VOB of the semiconductor device 100 is transmitted to another semiconductor device in the same system having the semiconductor device 100 therein through external cables 210, 220. The reference circuit 110 generates the reference voltage VREF used for comparing impedance of the external cables and load impedance in the semiconductor device 100. The impedance control signal generating circuit 130 generates the impedance control signals CO1, CO2, CO3, CO4, CO5 and CO6 used for adjusting resistance values of load resistors of the reference circuit 110 and the transmission driving circuit 120. The reference circuit 110 and the transmission driving circuit 120 have variable impedance circuits, respectively, which are the same structure. The reference circuit 110 and the transmission driving circuit 120 are designed in such a manner that load impedances therein are matched with impedance of the external cable 200. However, sometimes, load impedances of the reference circuit 110 and the transmission driving circuit 120 are not matched with the impedance of the external cable 200 due to a parameter change of semiconductor device fabrication process. In such a case of impedance mismatching, the impedance control signals generated from the impedance control signal generating circuit 130 controls the variable impedance circuits (not shown) in the reference circuit 110 and the transmission generating circuit 120 so as for the load impedances of the reference circuit 110 and the transmission driving circuit 120 to be matched with the impedance of the external cable 200.

Figure 3:
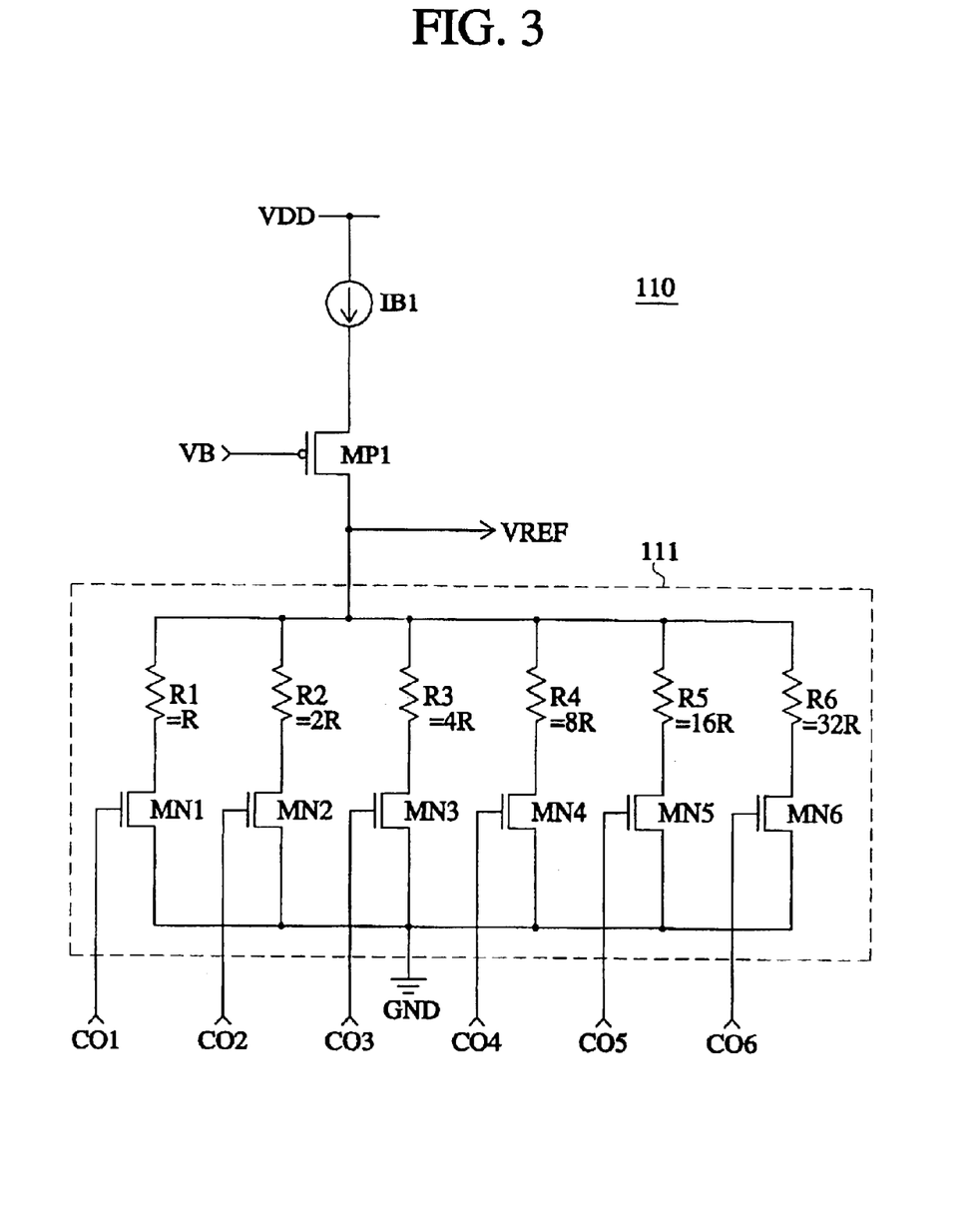
FIG. 3 is a circuit diagram of a reference circuit shown in FIG. 1.

FIG. 3 illustrates the detailed circuit diagram of the reference circuit in FIG. 1. Referring to FIG. 3, the reference circuit 110 comprises a PMOS transistor MP1 with a gate electrode to which a bias voltage VB is applied and a drain electrode from which the reference voltage VREF is output, a current source IB1 connected between a power supply voltage VDD and a source electrode of the PMOS transistor MP1 for supplying current, and a variable impedance circuit 111 connected between the drain electrode of the PMOS transistor MP1 and a ground voltage GND for receiving the impedance control signals CO1, CO2, CO3, CO4, CO5 and CO6 and varying resistance values of the circuit 110.

The variable impedance circuit 111 comprises a plurality of resistors R1, R2, R3, R4, R5 and R6 having corresponding respective one ends commonly connected to the drain electrode of the PMOS transistor MP1, and a plurality of NMOS transistors MN1, MN2, MN3, NM4, NM5 and MN6 connected between corresponding respective the other ends of the resistors R1, R2, R3, R4, R5 and R6 and a ground voltage GND and having respective gate electrodes to which the corresponding respective impedance control signals CO1, CO2, CO3, CO4, CO5 and CO6 are applied.

The operation of the reference circuit shown in FIG. 3 will be described below.

The reference voltage VREF varies based on impedance value of the variable impedance circuit 111. Impedance value of the variable impedance circuit 111 varies based on the state of the NMOS transistors MN1, NM2, MN3, NM4, NM5 and NM6. Respective gate electrodes of the NMOS transistors MN1, MN2, MN3, MN4, MN5 and MN6 receive corresponding respective impedance control signals CO1, CO2, CO3, CO4, CO5 and CO6. If the received control signal has logic "high" level, the corresponding NMOS transistor is turned on, and the corresponding resistor operates as a resistor. The resistors R1, R2, R3, R4, R5 and R6 are weighted and they have different resistance values. In accordance with one embodiment of the present invention, the resistors R1, R2, R3, R4, R5 and R6 are weighted in a manner of R1=R, R2=2R, R3=4R, R4=8R, R5=16R and R6=32R. As the number of the on-transistors of the NMOS transistors MN1, MN2, MN3, MN4, MN5 and MN6 becomes greater, impedance value of the variable impedance circuit 111 becomes smaller, and as the number of off-transistors of the NMOS transistors MN1, MN2, MN3, MN4, MN5 and MN6 is greater, impedance value of the variable impedance circuit 111 becomes greater.

Figure 4:
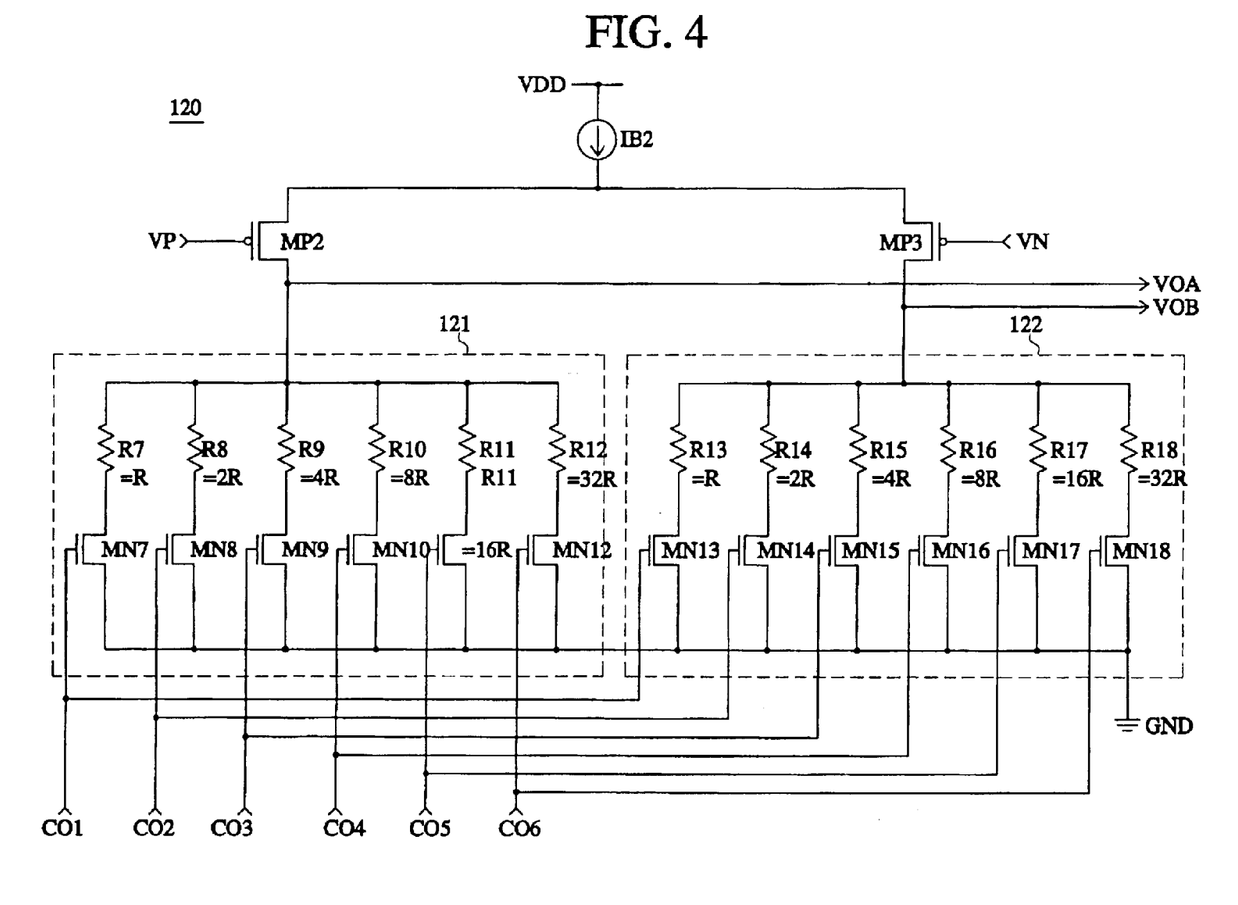
FIG. 4 is a circuit diagram of a transmission driving circuit shown in FIG. 1.

FIG. 4 illustrates the detailed circuit diagram of the transmission driving circuit shown in FIG. 1. Referring to FIG. 4, the transmission driving circuit 120 comprises a PMOS transistor MP2 with a gate electrode to which a first input signal VP is input and a drain electrode from which a first output signal VOA is output, a current source IB2 connected between a power supply voltage VDD and a source electrode of the PMOS transistor MP2 for supplying a current, a PMOS transistor MP3 with a source electrode connected to the source electrode of the PMOS transistor MP2, a gate electrode to which a second input signal VN is input, and a drain electrode from which a second output signal VOB is output, a variable impedance circuit 121 connected between the drain electrode of the PMOS transistor MP2 and a ground voltage GND for receiving the impedance control signals CO1, CO2, CO3, CO4, CO5 and CO6 and changing resistance values thereof, and a variable impedance circuit 122 connected between the drain electrode of the PMOS transistor MP3 and a ground voltage GND for receiving the impedance control signals CO1, CO2, CO3, CO4, CO5 and CO6 and changing resistance values therein.

The variable impedance circuit 121 comprises a plurality of resistors R7, R8, R9, R10, R11 and R12 connected to the drain electrode of the PMOS transistor MP2 at respective one ends, and a plurality of NMOS transistors MN7, MN8, MN9, MN10, MN11 and MN12 connected between the other end of each of the resistors R7, R8, R9, R10, R11 and R12 and a ground voltage GND and having respective gate electrodes to which corresponding respective impedance control signals CO1, CO2, CO3, CO4, CO5 and CO6 is input.

The variable impedance circuit 122 comprises a plurality of resistors R13, R14, R15, R16, R17 and R18 connected to the drain electrode of the PMOS transistor MP3 at respective one ends thereof, and a plurality of NMOS transistors MN13, MN14, MN15, MN16, MN17 and MN18 connected between the other end of each of the resistors R13, R14, R15, R16, R17 and R18 and a ground voltage GND and having respective gate electrodes to which corresponding respective impedance control signals CO1, CO2, CO3, CO4, CO5 and CO6 is input.

The operation of the transmission driving circuit 120 shown in FIG. 4 will be described below.

The variable impedance circuits 121, 122 in the transmission driving circuit 120 are controlled by the impedance control signals CO1, CO2, CO3, CO4, CO5 and CO6, and designed in such a manner that they have the same impedance value at the same time. Further, the variable impedance circuits 121, 122 are also designed in such a manner that they have the same impedance value as the impedance value of the variable impedance circuit 111. Impedance value of the variable impedance circuit 121 varies based on the state of the NMOS transistors MN7, MN8, MN9, MN10, MN11 and MN12. The respective gate electrode of the NMOS transistors MN7, MN8, MN9, MN10, MN11 and MN12 receives the corresponding signal of the impedance control signals CO1, CO2, CO3, CO4, CO5 and CO6. When the control signals CO1, CO2, CO3, CO4, CO5 and CO6 are in logic "high" level, the corresponding NMOS transistors MN7, MN8, MN9, MN10, MN11 and MN12 are turned on, and the resistors R7, R8, R9, R10, R11 and R12 connected to the NMOS transistors MN7, MN8, MN9, MN10, MN11 and MN12 in series operate as resistors. Since the resistors R7, R8, R9, R10, R11 and R12 are weighted, they have different resistance values. In accordance with one embodiment of the present invention, the resistors R7, R8, R9, R10, R11 and R12 are weighted in such a manner of R7=R, R8=2R, R9=4R, R10=8R, R11=16R and R12=32R. As the number of on-transistors of the NMOS transistors MN7, MN8, MN9, MN10, MN11 and MN12 becomes greater, impedance of the variable impedance circuit 121 becomes smaller, and as the number of off-transistors of the NMOS transistors MN7, MN8, MN9, MN10, MN11 and MN12 becomes greater, impedance of the variable impedance circuit 122 becomes greater. The variable impedance circuit 122 operates in the same way as the variable impedance circuit 121.

Figure 5:
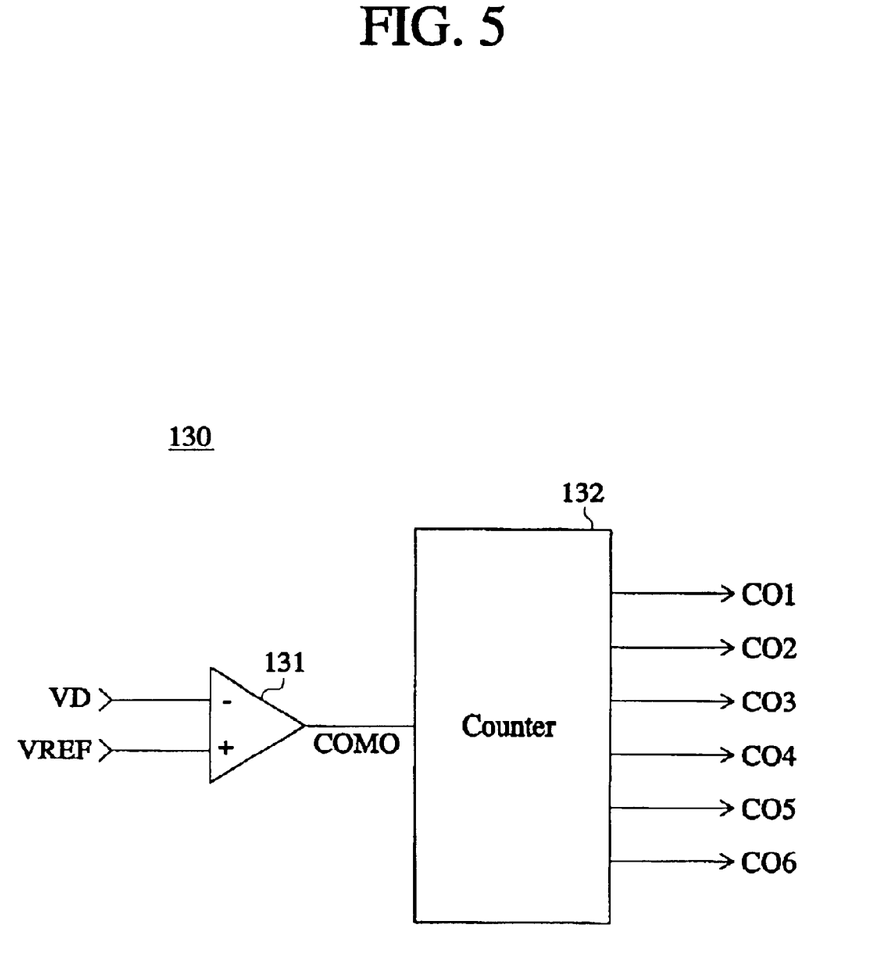
FIG. 5 is a circuit diagram of an impedance control signal generating circuit shown in FIG. 1.

FIG. 5 illustrates the detailed circuit diagram of the impedance control signal generating circuit shown in FIG. 1. Referring to FIG. 5, the impedance control signal generating circuit 130 comprises a comparator 131 for comparing a difference signal VD of the differential output signal VOA, VOB of the semiconductor device 100 with a reference voltage VREF and generating the result signal of the comparison, and a counter 132 for receiving the output signal COMO of the comparator 131 and generating 6-bit of digital signals CO1, CO2, CO3, CO4, CO5 and CO6.

The whole operation of the semiconductor 100 with impedance calibration function will be described below.

First, internal load impedance Z in the semiconductor device 100 is set to 50 $\Omega$. The internal load impedance Z is the impedance value of the respective variable impedance circuits 111, 121, 122 in FIG. 3 and FIG. 4. The input signal VP of the transmission driving circuit 120 has logic "low" level, and the input signal VN has logic "high" level. Further, current supplied by the current source IB2 to the transmission driving circuit 120 is two times larger than a current supplied to the reference circuit 110 by the current source IB1. If the current supplied to the transmission driving circuit 120 is I, the current supplied to the reference circuit 110 is I/2. In this condition, the reference voltage VREF is (IxZ)/2 and the output signal VOA has zero voltage since the input signal VP has logic "low" level. Further, since the input signal VN Is logic "high" and the load impedance Z and 50 $\Omega$ of impedance of the external cable are connected in parallel, the output signal VOB is Ix(Z//50 $\Omega$). As shown in FIG. 2, at a certain time T0, the input signal VP is transited to logic "high" level and the input signal VN is transited to logic "low" level and the output signal VOB becomes zero voltage and the output signal VOA is VOA=Ix(Z//50 $\Omega$). At a certain time T1 which is in a period between the time T0 and a point when reflected wave of the output signal VOA or VOB is returned after transmitted through the external cable, the comparator 131 latches the difference signal VD (VD=VOA−VOB) of the pair of differential output signals VOA, VOB. In FIG. 2, VD denotes the output signal level and TD denotes a delay time from the reference time T0 to a point when the output signal is latched. The reason of latching the output signal level before the reflected wave is returned is that, if not, it is not able to detect precise level of the output signal because the waveform distortion is caused when the reflected wave is returned in impedance mismatching state. As described above, the comparator 131 compares the latched output signal level VD and the reference voltage VREF generated by the reference circuit 110. If internal load impedance Z of the semiconductor device 100 is 50 $\Omega$ as initially set, the difference signal VD is the same as the reference voltage VREF, VD=VOA−VOB=Ix(Z//50 $\Omega$)=Ix25 $\Omega$=(IxZ)/2=VREF, so that the comparison operation is no more needed. If internal load impedance Z of the semiconductor device 100 is greater than 50 $\Omega$, parallel impedance of the load impedance Z and 50 $\Omega$ of impedance of the external cable is smaller than half the initially set load impedance Z, so that the reference voltage VREF is VREF=(IxZ)/2>Ix(Z//50 $\Omega$)=VD. At this time, the comparator 131 sends an output signal COMO to the counter 132 to reduce value of the load impedance Z. On the contrary, the internal load impedance Z of the semiconductor device 100 is smaller than 50 $\Omega$, the parallel impedance of the load impedance and 50 $\Omega$ of the impedance of the external cable is greater than half the initially set load impedance, so that the reference voltage VREF is VREF=(IxZ)/2<Ix(Z//50 $\Omega$)=VD. At this time, the comparator 131 sends the output signal COMO to the counter 132 to increase value of the load impedance Z.

For example, when the internal load impedance Z of the semiconductor device 100 is less than 50 $\Omega$, most significant bit (MSB) is CO6 and least significant bit (LSB) is CO1 of the impedance control signals CO1, CO2, CO3, CO4, CO5 and CO6 which are the output signals of the impedance control signal generating circuit 130. Accordingly, logic levels of the impedance control signals CO1, CO2, CO3, CO4, CO5, CO6 with logic levels 1, 0, 0, 0, 0, 0, respectively are changed to 0, 1, 1, 1, 1, 1, respectively. If the impedance control signals CO1, CO2, CO3, CO4, CO5, CO6 have logic levels 1, 0, 0, 0, 0, 0, respectively, only the NMOS transistor MN1 is turned on and the others are turned off. Accordingly, in the variable impedance circuit 111 of the reference circuit 110, the resistor R1 may affect to the load impedance Z. That is, Z=R. If the logic levels of the control signals CO1, CO2, CO3, CO4, CO5, CO6 are changed to 0, 1, 1, 1, 1, 1, respectively, only the NMOS transistor MN1 is turned off and the others are turned on. At this time, the resistors R2, R3, R4, R5 and R6 connected in parallel function as impedances. That is, the load impedance Z attributed from the variable impedance circuit 111 is Z=R2//R3//R4//R5//R6= 2R//4R//8R//16R//32R, so that the load impedance Z increases in comparison with the previous impedance R. The variable impedance circuits 121 and 122 in the transmission driving circuit 120 operate in the same manner as the variable impedance circuit 111 in the reference circuit 110, and change the load impedance.

In accordance with the one preferred embodiment of the present invention, each of the variable impedance circuits comprises six combinations of resistor-transistor connected in series and are controlled by six-bit impedance control signals, but the number of the combinations of resistor-transistor and the bit number of the impedance control signals may be increased when impedance is needed to be more finely adjusted.

What is claimed is:

1. A semiconductor device comprising:
   a reference circuit for receiving a plurality of impedance control signals and generating a reference voltage;
   a transmission driving circuit for receiving the impedance control signals and a pair of differential input signals and outputting a pair of differential output signals to an external cable; and
   an impedance control signal generating circuit for receiving a difference signal of the differential output signals and the reference voltage and generating the impedance control signals.

2. The semiconductor device according to claim 1, wherein the reference circuit comprises:
   a PMOS transistor with a gate electrode to which a bias voltage is applied and a drain from which the reference voltage is output;
   a current source connected between a power supply voltage and a source electrode of the PMOS transistor for supplying a current; and
   a variable impedance circuit connected between the drain electrode of the PMOS transistor and a ground voltage for receiving the impedance control signals and changing resistance value therein.

3. The semiconductor device according to claim 2, wherein the variable impedance circuit comprises:
   a plurality of resistors having respective one ends connected commonly to the drain electrode of the PMOS transistor; and
   a plurality of NMOS transistors connected between the other end of each of the resistors and a ground voltage, respectively, and having respective gate electrodes to which corresponding the respective impedance control signals are applied.

4. The semiconductor device according to claim 3, wherein the plurality of resistors have different resistance values having a predetermined pattern.

5. The semiconductor device according to claim 3, wherein the plurality of resistors have respective resistance values ranging from R to $2^{(N-1)}R$, when the impedance control signals are consisted of N bits and a resistor having the least resistance value is R.

6. The semiconductor device according to claim 1, wherein the transmission driving circuit comprises:
   a first PMOS transistor with a gate electrode to which a first differential input signal is applied and a drain electrode from which a first differential output signal is output;
   a current source connected between a power supply voltage and a source electrode of the PMOS transistor for supplying a current;
   a second PMOS transistor with a source electrode connected to the source elecrode of the first PMOS transistor, a gate electrode to which a second differential input signal is applied and a drain electrode from which a second differential output signal is output;
   a first variable impedance circuit connected between the drain electrode of the first PMOS transistor and a ground voltage for receiving the impedance control signals and changing resistance values; and
   a second variable impedance circuit connected between the drain electrode of the second PMOS transistor and a ground voltage for receiving the impedance control signals and changing resistance values,
   wherein the first variable impedance circuit and the second variable impedance circuit have the same impedance value at the same time.

7. The semiconductor device according to claim 6, wherein the first variable impedance circuit comprises:
   a plurality of resistors having respective one ends connected commonly to the drain electrode of the first PMOS transistor; and
   a plurality of NMOS transistors connected between corresponding the other ends of the resistors and a ground voltage, respectively, and having respective gate electrodes to which corresponding signal of the impedance control signals are applied.

8. The semiconductor device according to claim 6, wherein the second variable impedance circuit comprises:
   a plurality of resistors having respective one ends connected commonly to the drain electrode of the second PMOS transistor; and
   a plurality of NMOS transistors connected between corresponding the other ends of the resistors and a ground voltage, respectively, and having respective gate electrodes to which corresponding signal of the impedance control signals are applied.

9. The semiconductor device according to claim 7, wherein the plurality of resistors have different resistance values with a predetermined pattern.

10. The semiconductor device according to claim 7, wherein the plurality of resistors have respective resistance values ranging from R to $2^{(N-1)}R$, when the impedance control signals are consisted of N bits and a resistor having the least resistance value is R.

11. The semiconductor device according to claim 8, wherein the plurality of resistors have different resistance values with a predetermined pattern.

12. The semiconductor device according to claim 8, wherein the plurality of resistors have respective resistance values ranging from R to $2^{(N-1)}R$, when the impedance control signals are consisted of N bits and a resistor having the least resistance value is R.

13. The semiconductor device according to claim 1, wherein the impedance control signal generating circuit comprises:

a comparator for receiving a difference signal of the first and second differential output signals and the reference voltage, comparing the same with each other, and generating the result signal of the comparison; and a counter for receiving the result signal output from the comparator and generating the impedance control signals.

* * * * *

UNITED STATES PATENT AND TRADEMARK OFFICE
CERTIFICATE OF CORRECTION

PATENT NO. : 6,833,729 B2
APPLICATION NO. : 10/458041
DATED : December 21, 2004
INVENTOR(S) : Yang Gyun Kim et al.

It is certified that error appears in the above-identified patent and that said Letters Patent is hereby corrected as shown below:

Title page,
Item [57], ABSTRACT,
Line 7, after "a" delete "difference" and insert -- different --.

Column 2,
Lines 2 and 49, after "a" delete "difference" and insert -- different --.

Column 3,
Line 28, after "a" delete "difference" and insert -- different --.

Column 5,
Line 65, after "a" (second occurrence) delete "difference" and insert -- different --.

Column 6,
Line 32, after "the", delete "difference" and insert -- different --.

Column 7,
Line 40, after "a" delete "difference" and insert -- different --.

Column 9,
Line 6, after "a", (second occurrence) delete "difference" and insert -- different --.

Signed and Sealed this

Twenty-seventh Day of June, 2006

JON W. DUDAS
*Director of the United States Patent and Trademark Office*